US006809555B1

(12) United States Patent
Nguyen

(10) Patent No.: US 6,809,555 B1
(45) Date of Patent: Oct. 26, 2004

(54) GLITCH-FREE DIGITAL PHASE DETECTOR CIRCUITS AND METHODS WITH OPTIONAL OFFSET AND LOCK WINDOW EXTENSION

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/428,342

(22) Filed: May 2, 2003

(51) Int. Cl.$^7$ ................................................ H04L 7/02
(52) U.S. Cl. ............................................ 327/3; 327/12
(58) Field of Search ............................. 327/1, 2, 3, 4, 327/5, 6, 7, 8, 9, 10, 11, 12

(56) References Cited

U.S. PATENT DOCUMENTS

| | | | | |
|---|---|---|---|---|
| 5,223,755 A | * | 6/1993 | Richley ....................... | 327/158 |
| 5,859,552 A | * | 1/1999 | Do et al. ..................... | 327/170 |
| 6,351,154 B2 | * | 2/2002 | Brachmann et al. .......... | 327/12 |
| 2003/0190001 A1 | * | 10/2003 | Gregorian et al. .......... | 375/361 |

OTHER PUBLICATIONS

R. Jacob Baker, Harry W. Li, David E. Boyce; *CMOS–Circuit Design, Layout, and Simulation*; Chapter 19; Copyright 1998; IEEE Press Marketing; pp. 417–418.

Neil H.E. Weste, Kamran Esthraghian; *Principles of CMOS VLSI Design—A Systems Perspective*; Second Edition; Addison–Wesley Publishing Company; Copyright 1993 by AT&T; pp. 685–686.

Neil H.E. Weste, Kamran Esthraghian; *Principles of CMOS VLSI Design—A Systems Perspective*; Second Edition; Addison–Wesley Publishing Company; Copyright 1993 by AT&T; pp. 398–403.

Neil H.E. Weste, Kamran Esthraghian; *Principles of CMOS VLSI Design—A Systems Persepective*; Second Edition; Addison–Wesley Publshing Company; Copyright 1993 by AT&T; pp. 373–383.

2001 IEEE International Solid–State Circuits Conference—Digest of Technical Papers; vol. Forty–Four; Feb. 5–7, 2001; pp. 396–397.

Behzad Razavi; *Monolithic Phase–Locked Loops and Clock Recovery Circuits—Theory and Design*; "Design of Monolithic Phase–Locked Loops and Clock Recovery Circuits—A Tutorial"; IEEE Press; Copyright 1996 The Institute of Electrical and Electronics Engineers, Inc.; pp. 1–7 [particularly pp. 5–6].

C. Andrew Sharpe; *Monolithic Phase–Locked Loops and Clock Recovery Circuits—Theory and Design*; "A 3–State Phase Detector can Improve Your Next PLL Design"; IEEE Press; Copyright 1996 The Institute of Electrical and Electronics Engineers, Inc.; pp. 224–228 [particularly pp. 224–227].

(List continued on next page.)

*Primary Examiner*—Linh M. Nguyen
(74) *Attorney, Agent, or Firm*—Lois D. Cartier

(57) ABSTRACT

Simple, glitch-free phase detector circuits provide add and subtract output signals indicating the phase relationship between two input clock signals. Some embodiments also provide a lock output signal having a lock window, and in some of these embodiments, the size of the lock window is programmable. An optionally delayed version of the feedback clock signal is stored a first time when the input clock signal goes high, then stored a second time after a predetermined delay. In some embodiments, the predetermined delay is programmable. When both stored values are low, the subtract output signal is active. When the first stored value is high, the add output signal is active, regardless of the state of the second stored value. When the first stored value is low and the second stored value is high, the two clocks are synchronized and the phase detector indicates a lock condition.

40 Claims, 11 Drawing Sheets

OTHER PUBLICATIONS

Kurt M. Ware et al.; *Monolithic Phase–Locked Loops and Clock Recovery Circuits—Theory and Design*; "A 200–MHz CMOS Phase–Locked Loop with Dual Phase Detectors"; IEEE Press; Copyright 1996 The Institute of Electrical and Electronics Engineers, Inc.; pp. 292–300 [particularly pp. 295–298.

Mehmet Soyuer et al.; *Monolithic Phase–Locked Loops and Clock Recovery Circuits—Theory and Design*; "High–Frequency Phase–Locked Loops in Monolithic Bipolar Technology"; IEEE Press; Copyright 1996 The Institute of Electrical and Electronics Engineers, Inc.; 1 pp. 301–309 [particularly pp. 305–306].

Mark G. Johnson et al.; *Monolithic Phase–Locked Loops and Clock Recovery Circuits—Theory and Design*; "A Variable Delay Line PLL for CPU—Coprocessor Synchronization"; IEEE Press; Copyright 1996 The Institute of Electrical and Electronics Engineers, Inc.; pp. 333–360 [particularly pp. 335–336].

Dejan Mijuskovic et al.; *Monolithic Phase–Locked Loops and Clock Recovery Circuits—Theory and Design*; "Cell–Based Fully Integrated CMOS Frequency Synthesizers"; IEEE Press; Copyright 1996 The Institute of Electrical and Electronics Engineers, Inc.; pp. 361–368 [particularly pp. 362].

Ilya Novof et al.; *Monolithic Phase–Locked Loops and Clock Recovery Circuits—Theory and Design*; "Fully Integrated CMOS Phase–Locked Loop with 15 to 240 MHz Locking Range and ±50 ps Jitter"; IEEE Press; Copyright 1996 Institute of Electrical and Electronics Engineers, Inc.; pp. 369–376 [particularly pp. 371–372].

Lawrence M. DeVito; *Monolithic Phase–Locked Loops and Clock Recovery Circuits—Theory and Design*; "A Versatile Clock Recovery Architecture and Monolithic Implementation"; IEEE Press; Copyright 1996 The Institute of Electrical and Electronics Engineers, Inc.; pp. 405–420[particularly pp. 410–411].

Robert R. Cordell et al.; *Monolithic Phase–Locked Loops and Clork Recovery Circuits—Theory and Design*; "A 50 MHz Phase– and Frequency–Locked Loop"; IEEE Press; Copyright 1996 The Institute of Electrical and Electronics Engineers, Inc.; pp. 454–460 [particularly pp. 456–457].

S. Khursheed Enam et al.; *Monolithic Phase–Locked Loops and Clock Recovery Circuits—Theory and Design*; "NMOS IC's for Clock and Data Regeneration in Gigabit–per–Second Optical–Fiber Receivers"; IEEE Press; Copyright 1996 The Institute of Electrical and Electronics Engineers, Inc.; pp. 461–472 [particularly pp. 464–466].

Ricky F. Bitting et al.; ; *Monolithic Phase–Locked Loops and Clock Recovery Circuits—Theory and Design*; "A 30—128 MHz Frequency Synthesizer Standard Cell"; IEEE Press; Copyright 1996 The Institute of Electrical and Electronics Engineers, Inc.; pp. 355–359 [particularly pp. 358].

Neil H.E. Weste, Kamran Esthraghian; *Principles of CMOS VLSI Design—A Systems Perspective*; Second Edition; Addison–Wesley Publishing Company; Copyright 1993 by AT&T; pp. 391–392.

* cited by examiner (SUB=1)

(SUB=1)

(SUB=1)

(ADD=1)

(ADD=1)

(LOCK=1)

GLITCH-FREE DIGITAL PHASE DETECTOR CIRCUITS AND METHODS WITH OPTIONAL OFFSET AND LOCK WINDOW EXTENSION

FIELD OF THE INVENTION

The invention relates to phase detector circuits and methods. More particularly, the invention relates to digital phase detector circuits and methods having optional lock window offset and lock window extension features.

BACKGROUND OF THE INVENTION

Phase detector circuits are commonly used in today's digital integrated circuits. For example, a phase detector circuit is included in virtually every phase lock loop (PLL) and delay lock loop (DLL). A phase detector circuit is a circuit that compares the corresponding edges (e.g., rising edges) of two input clock signals, and provides two output signals indicating the phase relationship between the two input clock signals. The two output signals (sometimes called "Up" and "Down", or "Add" and "Subtract") indicate whether a feedback clock signal needs to be delayed or moved forward in order to be in phase with a reference clock signal. Some phase detector circuits also supply a third output signal (e.g., "Lock") that indicates when the two input clock signals are in phase and no adjustment is needed.

FIG. 1 is a block diagram of an exemplary system that includes a phase detector circuit. System 100 includes a clock adjust circuit 101 (e.g., a DLL in the pictured embodiment), a clock network 102, circuit elements 103, and phase detector circuit 104. Clock adjust circuit 101 includes a finite state machine 112, a delay chain including delay elements D0-Dn, and a multiplexer 111. The input clock signal CLKIN is provided to state machine 112, to the first element D0 in the delay chain, and to multiplexer 111. State machine 112 controls multiplexer 111 via select signal SEL to select one of the delayed clock signals from the delay chain. Thus, the amount of delay through clock adjust circuit 101 from input terminal CLKIN to output terminal CLKOUT depends on the state of state machine 112, which in turn depends on the signals ADD and SUB from phase detector 104.

Output signal CLKOUT from clock adjust circuit 101 is provided to a clock network 102, which drives the various circuit elements 103 included in the system. Clock network 102 also provides feedback clock signal FBCLK to phase detector circuit 104. Phase detector circuit 104 compares the phase of feedback clock signal FBCLK to the phase of input clock signal CLKIN, providing signals ADD and SUB. Signals ADD and SUB, in turn, control state machine 112 to either add more delay or shorten the delay through clock adjust circuit 101, as necessary to align corresponding edges of the two clock signals FBCLK and CLKIN. Phase detector circuit 104 is clocked by input clock signal CLKIN, and can optionally be reset by signal RST, which can also be used to reset state machine 112.

Optional output signal LOCK from phase detector circuit 104 can be used for various purposes, e.g., to enable and disable additional circuitry. For example, a system can include two clock adjust circuits coupled in series. The first clock adjust circuit can perform a coarse phase adjustment, and the second clock adjust circuit can perform a fine phase adjustment. The LOCK signal from the first clock adjust circuit can be used to enable the second clock adjust circuit only after a coarse lock has been achieved.

FIGS. 2–4 illustrate three value combinations for signals LOCK, ADD, and SUB. In FIG. 2, input clock signal CLKIN and feedback clock signal FBCLK are in phase. In this example, being "in phase" means the rising edges of the two clocks occur at the same time. Thus, the relative phase of the two signals is "locked", and the delay through the clock adjust circuit need not be changed. Signal LOCK is high (1), and signals ADD and SUB are low (0).

In FIG. 3, the rising edge of the feedback clock precedes the rising edge of the input clock by a time −Delta. Thus, additional delay needs to be added to the path through the clock delay circuit to bring the feedback clock signal FBCLK into phase with the input clock signal CLKIN. Thus, signal LOCK is low, signal ADD is high, and signal SUB is low. Because the clock signals are periodic signals, the clocks could also be brought into phase by reducing the delay through the clock delay circuit. However, it is preferable to make the smallest adjustment that will have the desired effect.

In FIG. 4, the rising edge of the feedback clock follows the rising edge of the input clock by a time +Delta. Thus, some of the delay needs to be removed from the path through the clock delay circuit to bring the feedback clock signal FBCLK into phase with the input clock signal CLKIN. Thus, signal LOCK is low, signal ADD is low, and signal SUB is high. Because the clock signals are periodic signals, the clocks could also be brought into phase by increasing the delay through the clock delay circuit. However, as noted above, it is preferable to make the smallest adjustment that will have the desired effect.

Returning now to FIG. 1, in the ideal case clock adjust circuit 101 operates as follows. When reset signal RST is high, signal SEL selects the clock input signal CLKIN as output clock signal CLKOUT. When reset signal RST goes low, signal ADD goes high. Clock adjust circuit 101 continues inserting additional delay into the clock path between the CLKIN and CLKOUT terminals until feedback clock signal FBCLK is precisely in phase with input clock signal CLKIN. At that point, signal LOCK goes high and signal ADD goes low. State machine 112 holds the current selection in multiplexer 111. However, if variations occur in temperature, power high voltage level, or the frequency of input clock signal CLKIN, the two edges can lose synchronization. In this case, one of signals ADD and SUB goes high, and signal LOCK goes low. Finite state machine 112 selects a differently delayed clock signal to provide to the CLKOUT terminal of clock adjust circuit 101, until the feedback clock signal FBCLK is again in phase with the input clock signal CLKIN. At that point, signal LOCK again goes high, while signals ADD and SUB are both low.

The previous paragraph describes the behavior of the clock adjust circuit in the ideal case. However, in the ideal case the delay through the clock adjust circuit has infinitely small gradations and the two clock signals can be precisely synchronized. Thus, exactly one of signals LOCK, ADD, and SUB can be high at any given time. However, in reality, it is often true that the two clock signals are rarely precisely synchronized. Nevertheless, the LOCK signal must be allowed to signal a lock on the clock signal. Therefore, a "lock window", is frequently provided, wherein the LOCK signal is active (e.g., high) whenever the feedback clock edge occurs within a predetermined time of the input clock edge. Hence, the LOCK signal can be high at the same time as one or the other of the ADD and SUB signals.

FIG. 5 illustrates the concept of a lock window. The lock window ranges from a time −Delta_syn preceding the input clock edge to a time +Delta_syn following the input clock edge. Whenever the corresponding edge (e.g., the rising edge) of the feedback clock signal FBCLK falls within this window, signal LOCK is high.

A small lock window is desirable when high accuracy is required. However, a small lock window makes the phase detector circuit sensitive to clock jitter. Therefore, some known systems include phase detector circuits having programmable lock windows. For example, one known DLL has a lock window that supports two predetermined values of Delta_syn. When the DLL first becomes active, Delta_syn has a first and lower value. Thus, the clock signals are precisely locked. However, as soon as the two clock signals are locked (e.g., signal LOCK goes high), the lock window is extended by increasing the value of Delta_syn. This feature reduces noise and power consumption by causing the DLL to go inactive again until the new extended window is exceeded.

Clearly, phase detector circuits are common and useful circuits. Therefore, it is desirable to provide improved phase detector circuits, e.g., phase detector circuits having glitch-free output signals. Further, it is desirable to provide flexible phase detector circuits that can be adapted for use in a variety of systems and applications.

SUMMARY OF THE INVENTION

The invention provides simple, glitch-free phase detector circuits that provide add and subtract output signals indicating the phase relationship between two input clock signals. Some embodiments also provide a lock output signal having a lock window, and in some of these embodiments, the size of the lock window is programmable with respect to the feedback clock. An optionally delayed version of the feedback clock signal is stored a first time when the input clock signal goes high, then stored a second time after a predetermined delay. In some embodiments, the predetermined delay is programmable. When both stored values are low, the subtract output signal is active. When the first stored value is high, the add output signal is active, regardless of the state of the second stored value. When the first stored value is low and the second stored value is high, the two clocks are synchronized and the phase detector indicates a lock condition.

According to one embodiment, a phase detector circuit includes a feedback input terminal, a clock input terminal, subtract and add output terminals, first and second memory elements, a first delay element, and a first logic gate. The first memory element has a clock terminal coupled to the clock input terminal of the phase detector circuit, a data input terminal coupled to the feedback input terminal of the phase detector circuit, and an output terminal coupled to the add output terminal of the phase detector circuit. The second memory element has a clock terminal, a data input terminal coupled to the feedback input terminal of the phase detector circuit, and an output terminal. The first delay element is coupled between the clock input terminal of the phase detector circuit and the clock terminal of the second memory element. The first logic gate has a first input terminal coupled to the output terminal of the first memory element, a second input terminal coupled to the output terminal of the second memory element, and an output terminal coupled to the subtract output terminal of the phase detector circuit. Finally, a signal on the add output terminal of the phase detector circuit is independent of a signal on the output terminal of the second memory element.

According to another embodiment, a system includes a clock input terminal, a clock adjust circuit, a clock network, a plurality of circuit elements, and a phase detector circuit. The clock adjust circuit has a clock input terminal coupled to the clock input terminal of the system, a subtract input terminal, an add input terminal, and a clock output terminal. The clock network has an input terminal coupled to the clock output terminal of the clock adjust circuit, a feedback output terminal, and additional output terminals. The circuit elements have clock input terminals coupled to the additional output terminals of the clock network.

The phase detector circuit includes a feedback input terminal, a clock input terminal, subtract and add output terminals, first and second memory elements, a first delay element, and a first logic gate. The feedback input terminal is coupled to the feedback output terminal of the clock network. The clock input terminal is coupled to the clock input terminal of the system. The subtract output terminal is coupled to the subtract input terminal of the clock adjust circuit. The add output terminal is coupled to the add input terminal of the clock adjust circuit. The first memory element has a clock terminal coupled to the clock input terminal of the phase detector circuit, a data input terminal coupled to the feedback input terminal of the phase detector circuit, and an output terminal coupled to the add output terminal of the phase detector circuit. The second memory element has a clock terminal, a data input terminal coupled to the feedback input terminal of the phase detector circuit, and an output terminal. The first delay element is coupled between the clock input terminal of the phase detector circuit and the clock terminal of the second memory element. The first logic gate has a first input terminal coupled to the output terminal of the first memory element, a second input terminal coupled to the output terminal of the second memory element, and an output terminal coupled to the subtract output terminal of the phase detector circuit. Finally, a signal on the add output terminal of the phase detector circuit is independent of a signal on the output terminal of the second memory element.

Another embodiment provides a method of detecting and reporting a difference in phase between an input clock signal and a feedback clock signal. The method includes: storing a first value of the feedback clock signal in a first memory element when the input clock signal changes state in a predetermined direction; delaying the input clock signal to provide a delayed input clock signal; storing a second value of the feedback clock signal in a second memory element when the delayed input clock signal changes state in the predetermined direction; providing an active subtract signal when each of the first and second memory elements stores a first predetermined value; and providing an active add signal when the first memory element stores a second predetermined value.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
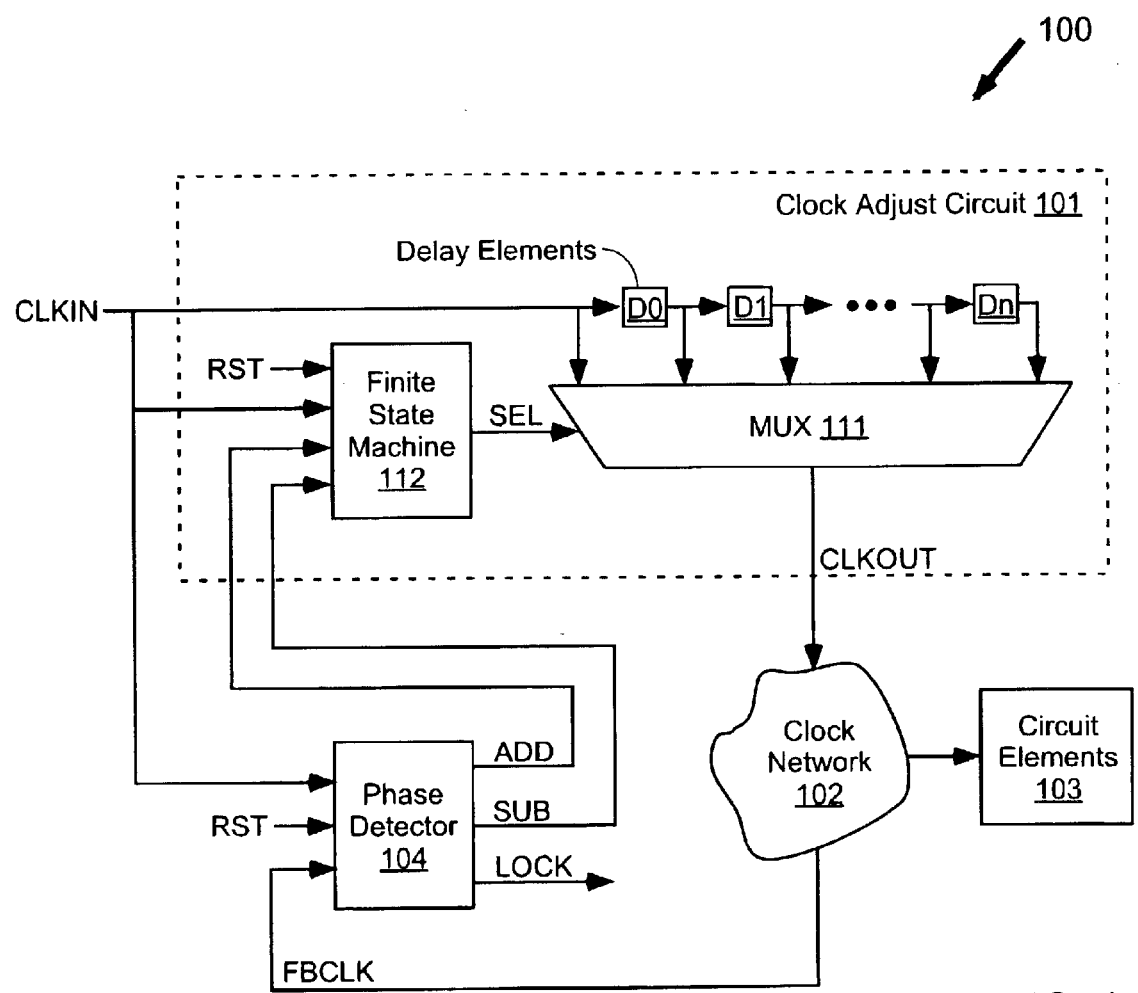
FIG. 1 shows a known system in which a phase detector circuit and a clock adjust circuit together bring a feedback clock signal into phase with an input clock signal.
Figure 2:
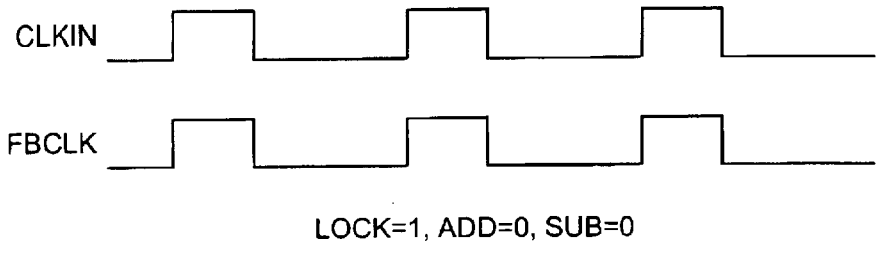
FIG. 2 is a waveform diagram illustrating a first phase relationship between a feedback clock signal and an input clock signal.
Figure 3:
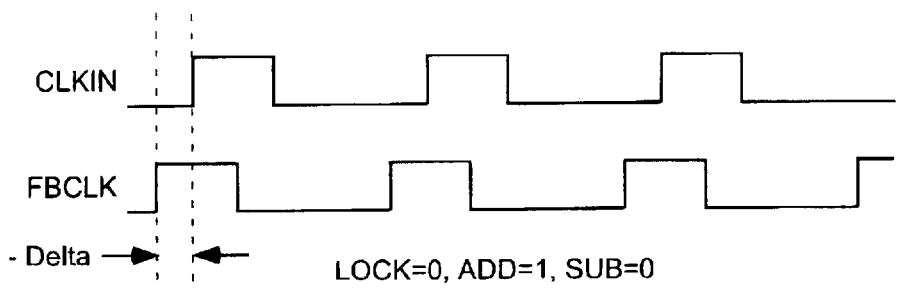
FIG. 3 is a waveform diagram illustrating a second phase relationship between a feedback clock signal and an input clock signal.
Figure 4:
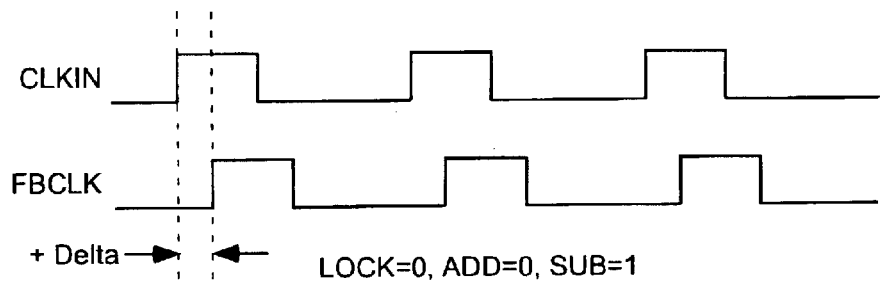
FIG. 4 is a waveform diagram illustrating a third phase relationship between a feedback clock signal and an input clock signal.
Figure 5:
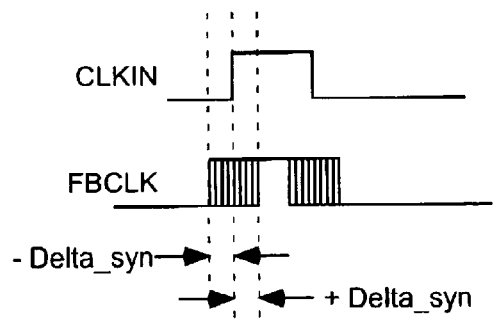
FIG. 5 is a waveform diagram illustrating the concept of a lock window.
Figure 6:
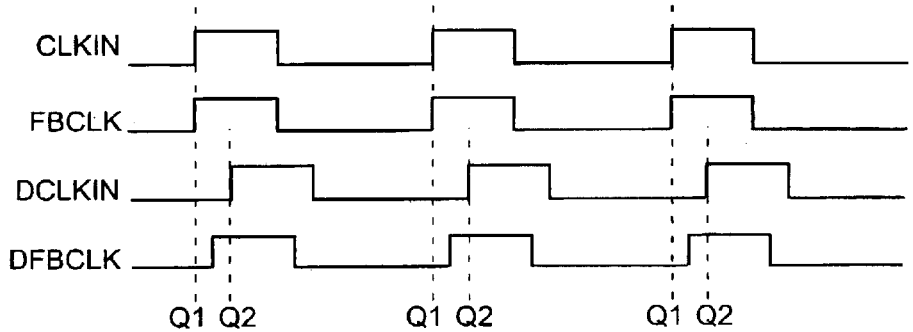
FIG. 6 is a waveform diagram illustrating the various clock signals employed by some embodiments of the present invention.

FIG. 6 illustrates various clock signals used in some embodiments of the present invention. Two clock signals are provided to a phase detector circuit. The two clock signals are an input clock signal CLKIN and a feedback clock signal FBCLK. Signals CLKIN and FBCLK can be, for example, similar to the signals of the same names shown in FIG. 1. As shown in FIG. 6, the desired relationship between signals CLKIN and FBCLK is that they have the same phase. In other words, the active edges (e.g., rising edges) of the two clocks should coincide. FIG. 6 also illustrates two additional signals created and used in some embodiments of the invention. Signal DCLKIN is a delayed version of the input clock signal CLKIN. Signal DFBCLK is a delayed version of the feedback clock signal FBCLK. The delay between signals CLKIN and DCLKIN is greater than the delay between signals FBCLK and DFBCLK. In some embodiments, there is no appreciable delay between signals FBCLK and DFBCLK, i.e., signal DFBCLK is the same signal as signal FBCLK.

In the illustrated embodiments, the two signals DCLKIN and DFBCLK (or FBCLK) are used as follows. A rising edge on signal CLKIN stores the value of signal DFBCLK (or FBCLK) in a first memory element as value Q1. A rising edge on signal DCLKIN stores the value of signal DFBCLK (or FBCLK) in a second memory element as value Q2. The values of Q1 and Q2 reflect the relationship between signals CLKIN and FBCLK as shown in Table 1, and show the action to be taken: add delay to the feedback path (Add), subtract delay from the feedback path (Subtract), or do neither (Locked).

TABLE 1

| Q1 | Q2 | Relationship | Action |
|---|---|---|---|
| 0 | 0 | Signal FBCLK lags signal CLKIN | Subtract |
| 0 | 1 | Rising edges are coincident | Locked |
| 1 | 0 | Signal FBCLK leads signal CLKIN | Add |
| 1 | 1 | Signal FBCLK leads signal CLKIN | Add |

Figure 6A:
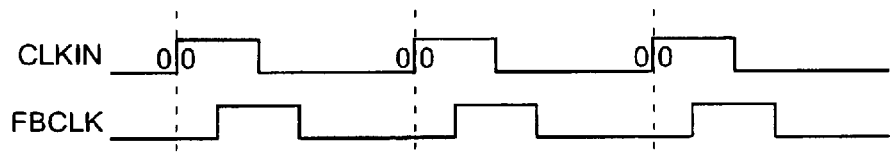
FIGS. 6A–6F are waveform diagrams illustrating six exemplary relationships between the input and feedback clock signals, and the effect of these relationships on a phase detector circuit implemented according to an embodiment of the present invention.
Figure 6B:
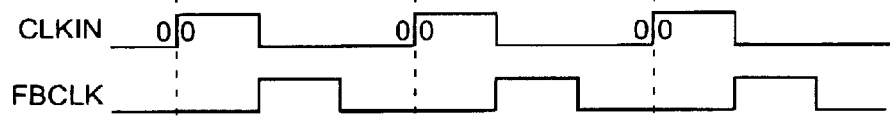

FIGS. 6A–6F illustrate six exemplary relationships that can apply between the two signals CLKIN and FBCLK. In FIGS. 6A and 6B, signal FBCLK lags the CLKIN signal. Stored values Q1 and Q2 are both low (signal FBCLK is low both when signal CLKIN goes high and shortly thereafter when signal DCLKIN goes high). Therefore, a phase detector circuit can detect signals Q1 and Q2 both being low and activate a subtract output signal to indicate that delay should be subtracted from the feedback path to bring the feedback clock signal into phase with the input clock signal.

Figure 6C:
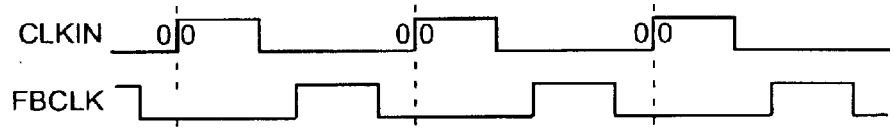

In FIG. 6C, the entire high pulse on feedback clock signal FBCLK occurs between the falling edge and the rising edge of input clock signal CLKIN. Therefore, the subtract signal is activated, because the stored values Q1 and Q2 are both low.

Figure 6D:
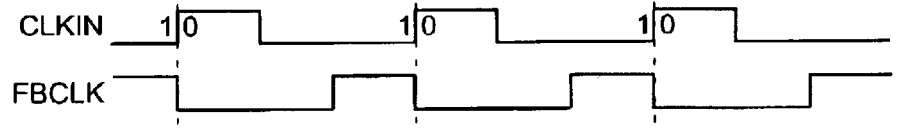

In FIG. 6D, signal FBCLK leads the CLKIN signal. Stored value Q1 is high and stored value Q2 is low (signal FBCLK changes from high to low just as signal CLKIN goes high and before signal DCLKIN goes high). Therefore, a phase detector circuit can detect signal Q1 being high and signal Q2 being low and activate an add output signal to indicate that delay should be added to the feedback path to bring the feedback clock signal into phase with the input clock signal.

Figure 6E:
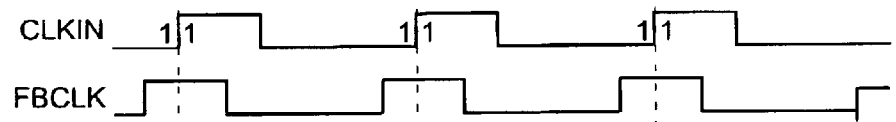

In FIG. 6E, signal FBCLK also leads the CLKIN signal. Stored values Q1 and Q2 are both high (signal FBCLK is high both when signal CLKIN goes high and shortly thereafter when signal DCLKIN goes high). Therefore, a phase detector circuit can detect signals Q1 and Q2 both being high and activate the add output signal.

Figure 6F:
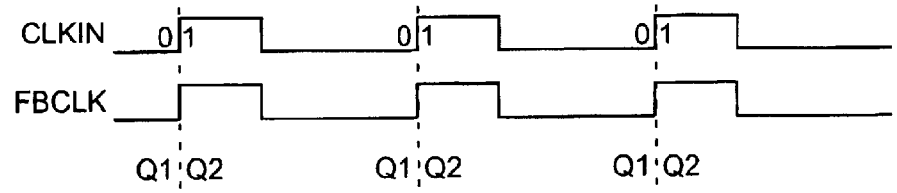

In FIG. 6F, signals FBCLK and CLKIN are in phase. Thus, when signal CLKIN goes high, a low value is stored for Q1. Shortly thereafter, when signal DCLKIN goes high, a high value is stored for Q2. A phase detector circuit can detect signal Q1 being low and signal Q2 being high, and can optionally provide a lock output signal. In some embodiments, when neither the add nor the subtract signal is high, a lock is assumed. In some embodiments, a lock signal is created by combining the add and subtract signals (e.g., using a NOR gate).

Figure 7:
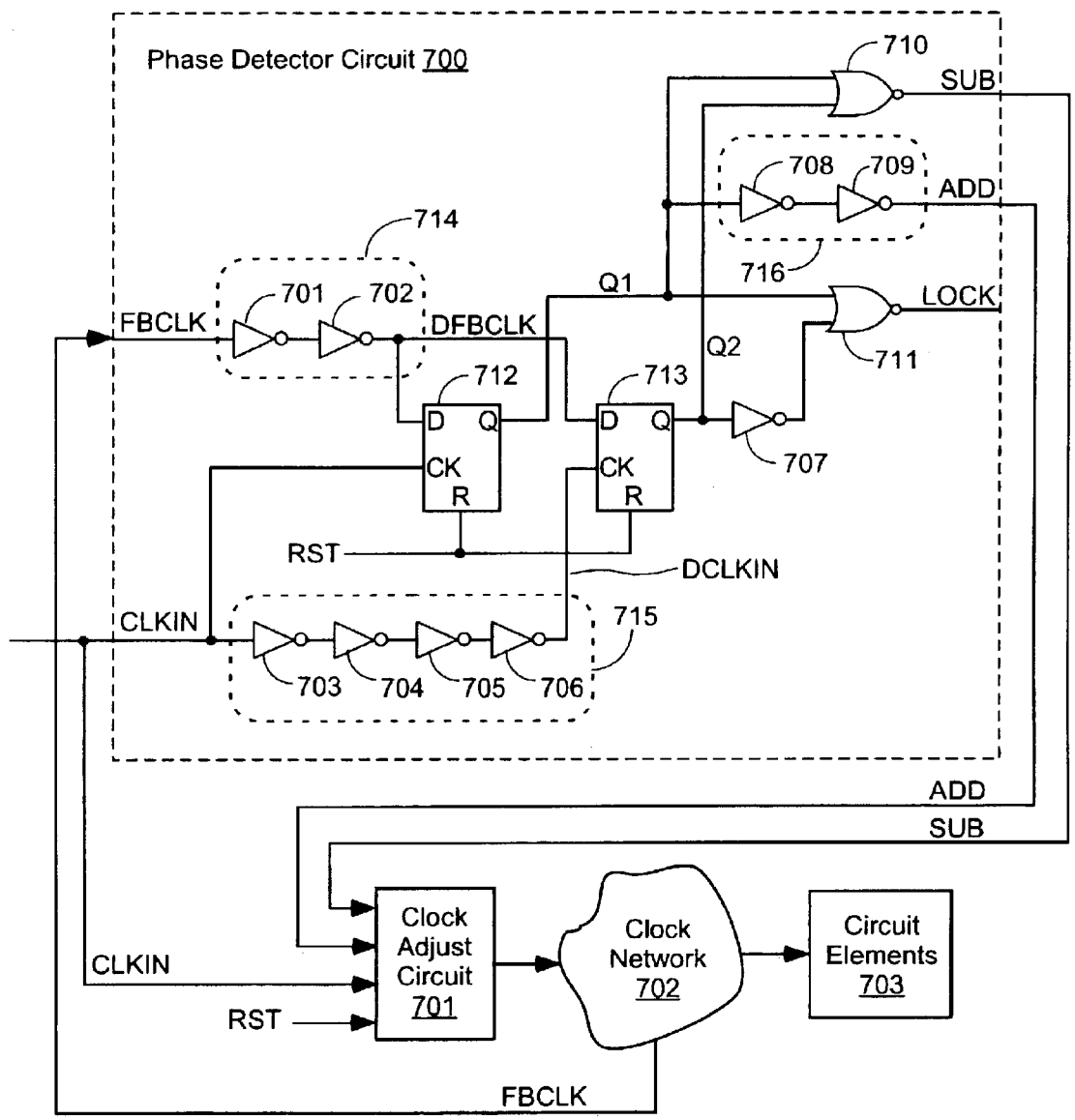
FIG. 7 shows a system including a first phase detector circuit in accordance with one embodiment of the invention.

FIG. 7 shows a system including a first phase detector circuit 700 according to one embodiment of the invention. Phase detector circuit 700 functions as previously described in connection with FIGS. 6A–6F. In the pictured embodiment, when output signal SUB is high, delay is removed from the feedback path by clock adjust circuit 701. When output signal ADD is high, delay is added to the feedback path by clock adjust circuit 701.

The system of FIG. 7 includes a phase detector circuit 700, a clock adjust circuit 701, a clock network 702, and circuit elements 703. In some embodiments, clock adjust circuit 701 is a DLL, e.g., similar to clock adjust circuit 101 of FIG. 1. In some embodiments, clock adjust circuit 701 is a PLL. Clock network 702 and circuit elements 703 can be, for example, the same as similar elements (102 and 103, respectively) shown in FIG. 1 and described in connection with that figure.

Phase detector circuit 700 accepts input clock signal CLKIN (e.g., from an external source), and also accepts feedback clock signal FBCLK from clock network 702. (In the present specification, the same reference characters are used to refer to terminals, waveforms, signal lines, and their corresponding signals.) Phase detector circuit 700 compares the phases of signals CLKIN and FBCLK and provides output signals SUB and ADD to clock adjust circuit 701 optionally, phase detector circuit 700 can also provide output signal LOCK.

Phase detector circuit 700 includes D flip-flops 712 and 713, delay elements 714 and 715, buffer 716, inverter 707, and NOR gates 710 and 711. Feedback clock signal FBCLK passes through delay element 714, which includes two inverters 701 and 702 coupled in series, to node DFBCLK. Input clock signal CLKIN passes through delay element 715, which includes four inverters 703–706 coupled in series, to node DCLKIN. Flip-flop 712 has a data input terminal D coupled to receive signal DFBCLK, a clock input terminal CK coupled to receive signal CLKIN, an optional reset terminal R coupled to receive a reset signal RST, and an output terminal Q that provides value Q1. Flip-flop 713 has a data input terminal D coupled to receive signal DFBCLK, a clock input terminal CK coupled to receive signal DCLKIN, an optional reset terminal R coupled to receive a reset signal RST, and an output terminal Q that provides value Q2.

NOR gate 710 provides the subtract output signal SUB and is driven by signals Q1 and Q2, optional buffer 716 includes two inverters 708–709 coupled in series, provides the add output signal ADD, and is driven by signal Q1. Optional NOR gate 711 provides the lock output signal LOCK, and is driven by signal Q1 and by signal Q2 inverted by inverter 707.

Note that the logic providing output signals SUB, ADD, and LOCK can be implemented in various ways. For example, signal SUB can be an active-low signal provided by a NAND gate, which is driven by the inverted output signals (Q1B and Q2B, not shown) from flip-flops 712 and 713. As another example, signal ADD can be an active low signal provided by a single inverter which is driven by signal Q1, or by the inverted output signal Q1B (not shown) from flip-flop 712. It will be apparent to one skilled in the art after reading this specification that the present invention can be practiced within these and other architectural variations.

Transistor sizes for the logic gates of FIG. 7 can vary based on the amount of delay desired. In some embodiments, minimum-sized transistors are used for all logic gates except for transistors in the delay elements. A minimum-sized transistor is the smallest transistor size supported by the fabrication process used to manufacture the circuit. Transistors in the delay elements are generally sized based on simulation results that mimic the circuit delays and the loading on the relevant signal lines.

Figure 8:
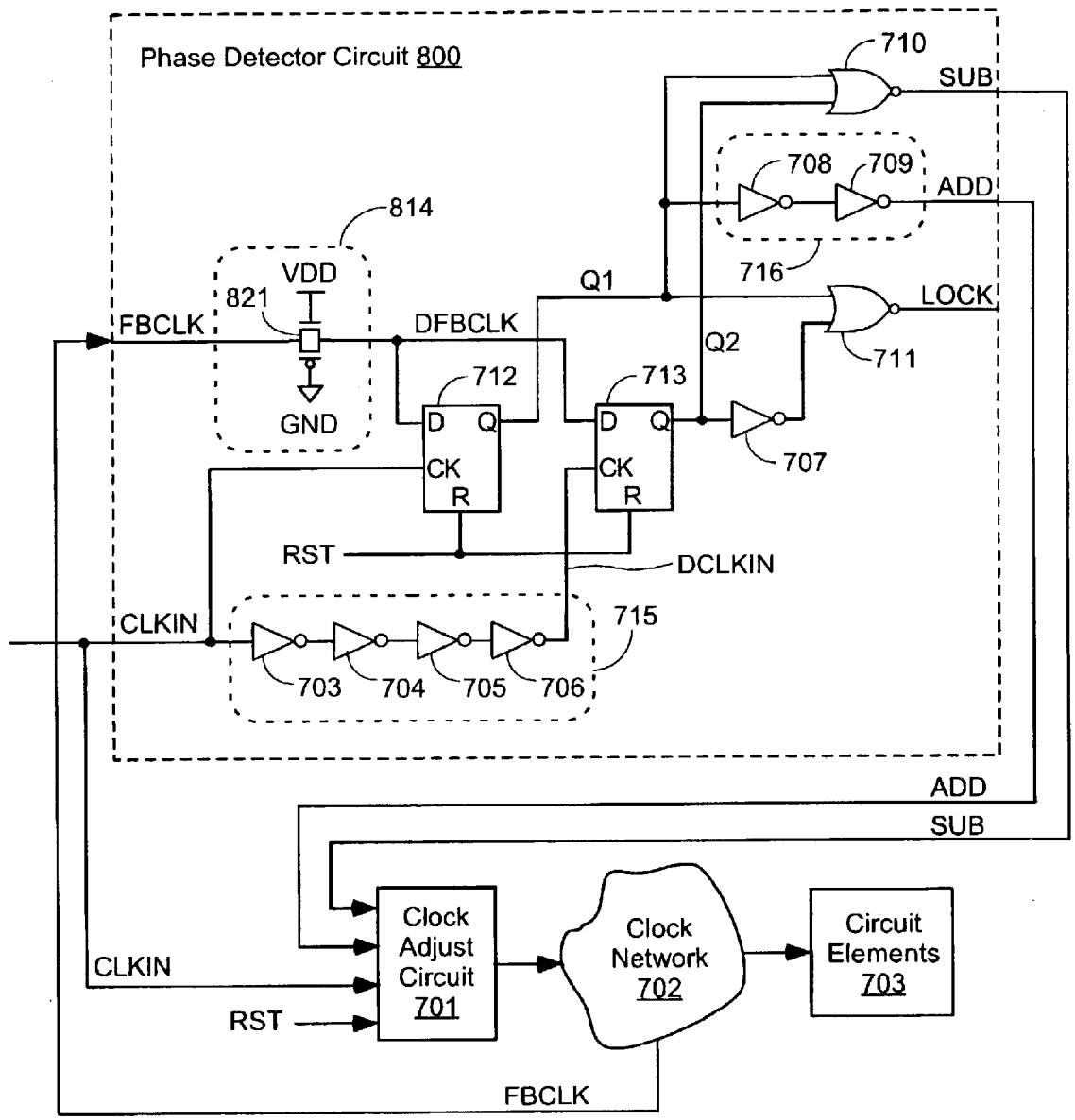
FIG. 8 shows a system including a second phase detector circuit in accordance with one embodiment of the invention.

In phase detector circuit 700 of FIG. 7, the lock window is offset to the right of the DFBCLK transition. In other words, signal DFBCLK is sampled on the rising edge of CLKIN, and again after a small delay caused by delay element 715. However, it can be desirable to have a lock window centered around the rising edge of signal CLKIN, for example. The lock window can be shifted to the left or the right, if desired, by changing the relative delays through the delay elements on the two clock paths. FIG. 8 provides an embodiment in which the lock window is approximately centered on the rising edge of signal CLKIN.

FIG. 8 shows a system including a second phase detector circuit 800 according to one embodiment of the invention. Phase detector circuit 800 is similar to phase detector circuit 700 of FIG. 7, except that delay element 714 is replaced by delay element 814. Delay element 814 is a CMOS transmission gate 821 with an N-channel gate terminal coupled to power high VDD and a P-channel gate terminal coupled to ground GND. Thus, transmission gate 821 is enabled whenever power is applied to phase detector circuit 800. However, transmission gate 821 has an inherent resistance, and therefore acts as a delay element. Other types of delay elements can also be used, as will be apparent to those of ordinary skill in the art.

Figure 9:
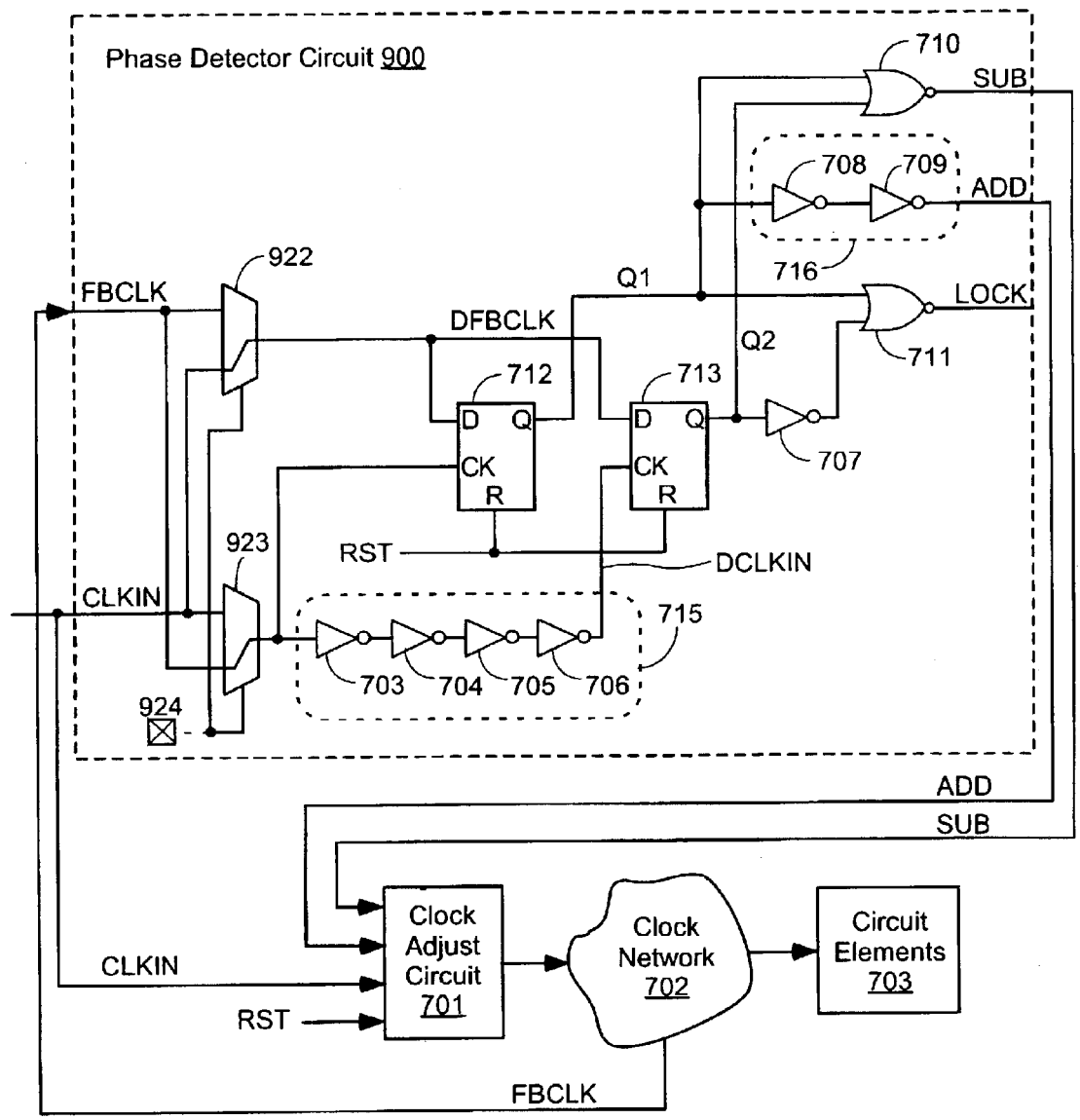
FIG. 9 shows a system including a third phase detector circuit in accordance with one embodiment of the invention.

FIG. 9 shows a system including a third phase detector circuit 900 according to one embodiment of the invention. Phase detector circuit 900 is modified to permit optionally shifting the lock window even further to the left by programmably switching the two clock input signals, CLKIN and FBCLK.

Phase detector circuit 900 is similar to phase detector circuit 700 of FIG. 7, except that delay element 714 is removed and multiplexers 922 and 923 are added. Multiplexer 922 selects between signals FBCLK and CLKIN to provide signal DFBCLK. Multiplexer 923 selects between signals CLKIN and FBCLK to provide a clock signal to flip-flop 712 and delay element 715. Multiplexers 922 and 923 are controlled by an offset left/right select signal. In one embodiment, phase detector circuit 900 is part of a programmable logic device (PLD), and the offset left/right select signal is provided by a configuration memory cell 924 of the PLD. In another embodiment, the offset left/right select signal is an external signal. In other embodiments, the offset left/right select signal is provided by other logic (not shown) included in the clock phase detector circuit.

Figure 10:
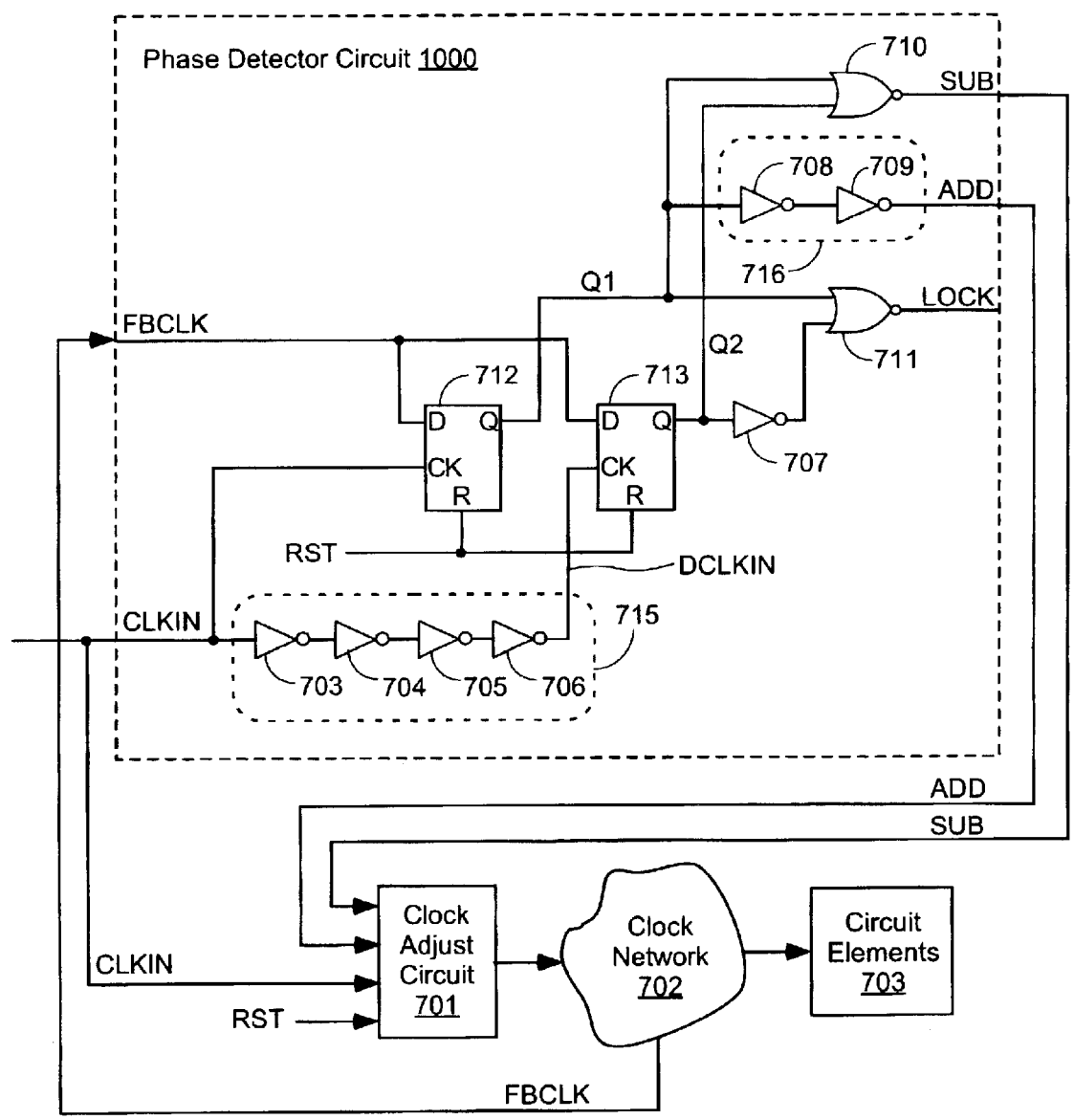
FIG. 10 shows a system including a fourth phase detector circuit in accordance with one embodiment of the invention.

FIG. 10 shows a system including a fourth phase detector circuit 1000 according to one embodiment of the invention. Phase detector circuit 1000 is similar to phase detector circuit 700 of FIG. 7, but is modified to shift the lock window to the right by removing delay element 714.

Figure 11:
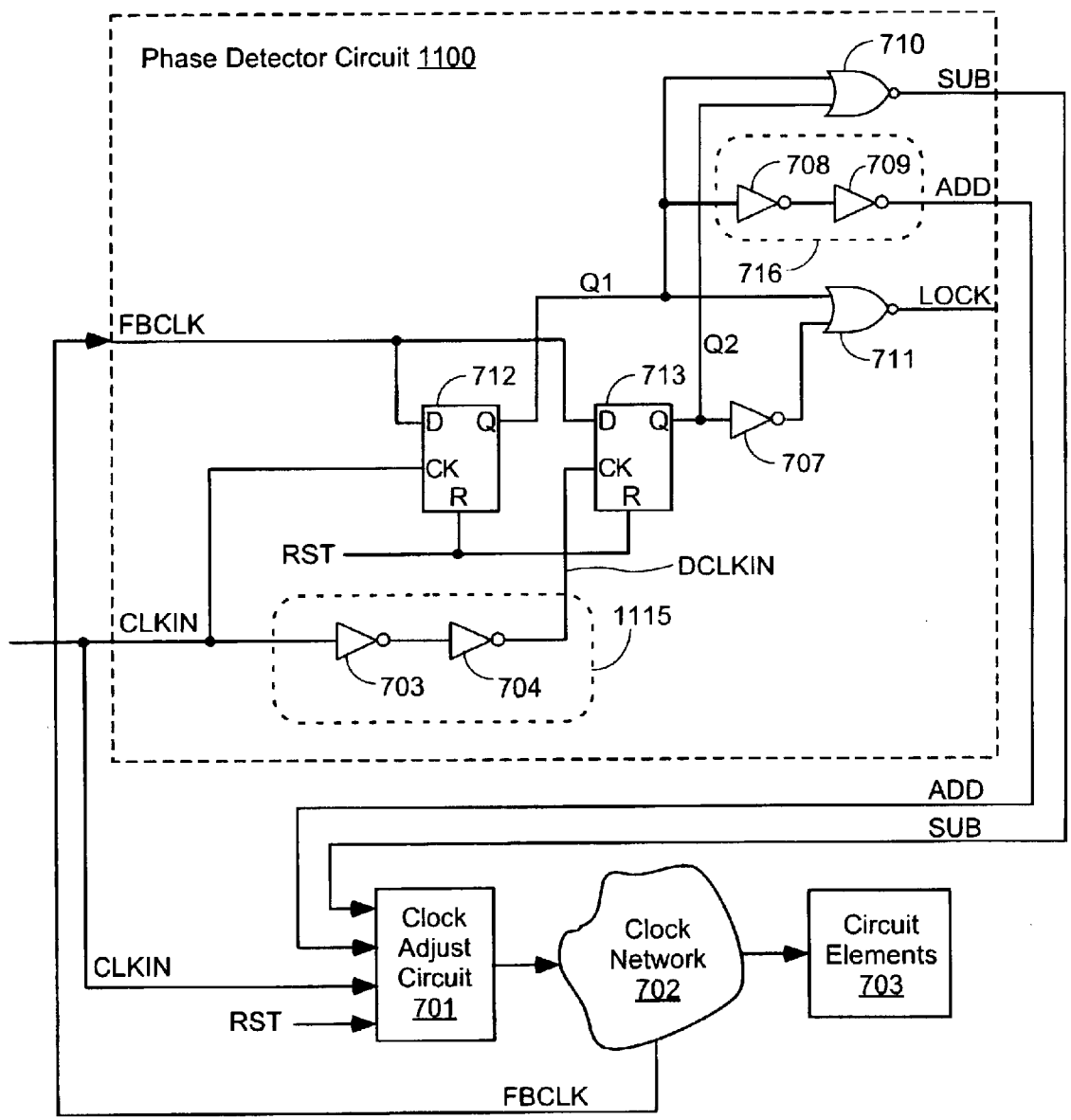
FIG. 11 shows a system including a fifth phase detector circuit in accordance with one embodiment of the invention.

FIG. 11 shows a system including a fifth phase detector circuit 1100 according to one embodiment of the invention. Phase detector circuit 1100 is similar to phase detector circuit 1000 of FIG. 10, except that delay element 715 is replaced by delay element 1115. Delay element 1115 includes two inverters 703, 704 coupled in series. Thus, the delay is shorter than in delay element 715 of FIG. 10, for example. This shorter delay on the path between signals CLKIN and DCLKIN narrows the lock window by shortening the delay between the storing of values Q1 and Q2.

It will be apparent to those of ordinary skill in the art that other delay elements can also be used on the path between the CLKIN input terminal and node DCLKIN.

Figure 12:
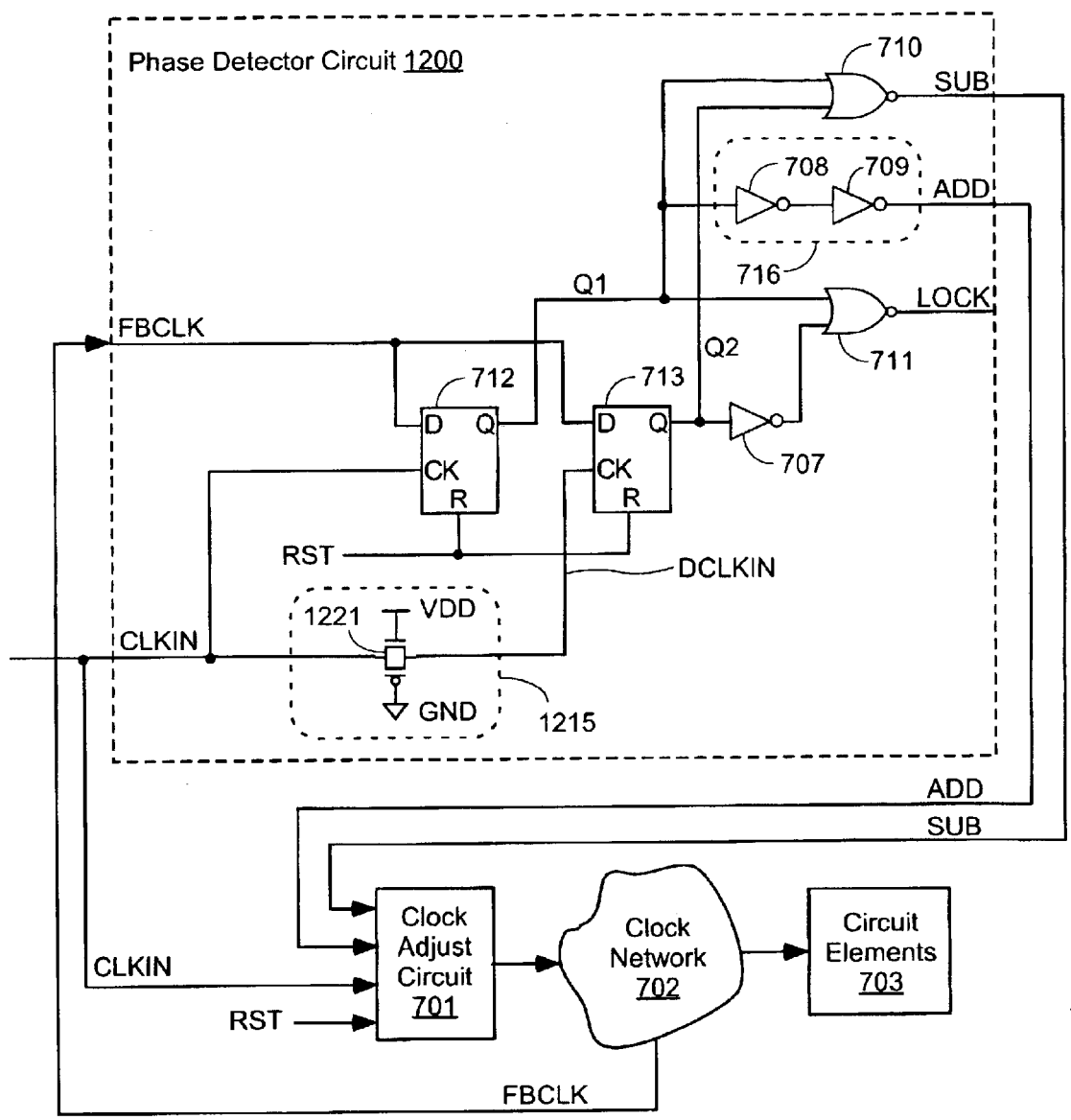
FIG. 12 shows a system including a sixth phase detector circuit in accordance with one embodiment of the invention.

For example, FIG. 12 shows a system including a sixth phase detector circuit 1200 according to one embodiment of the invention. In the embodiment of FIG. 12, delay element 1215 on the path between the CLKIN input terminal and node DCLKIN includes a CMOS pass transistor 1221. CMOS pass transistor 1221 has an N-channel gate terminal coupled to power high VDD and a P-channel gate terminal coupled to ground GND. The embodiment of FIG. 12 has a very narrow lock window, because the delay through a single transmission gate 1221 is very small.

Figure 13:
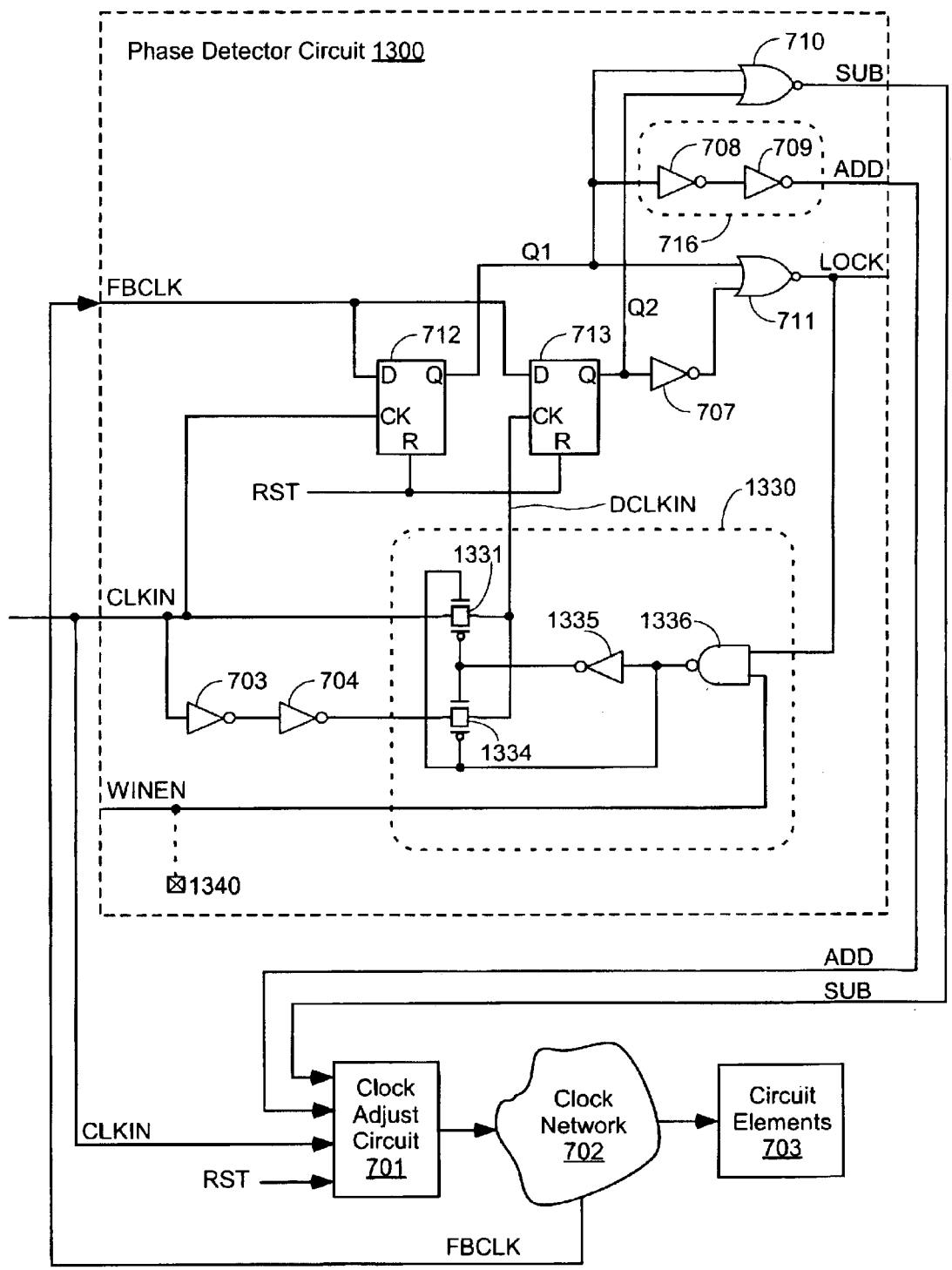
FIG. 13 shows a system including a seventh phase detector circuit in accordance with one embodiment of the invention.

FIG. 13 shows a system including a seventh phase detector circuit 1300 according to one embodiment of the invention. Phase detector circuit 1300 is similar to phase detector circuit 1100 of FIG. 11, except that the delay on the path between the CLKIN input terminal and node DCLKIN is made programmable by the addition of window extension circuit 1330. Window extension circuit 1330 first causes the lock window of phase detector circuit 1300 to have a narrower extent, as described below. Then, when a lock has been achieved (e.g., in the pictured embodiment, when signal LOCK goes high) the width of the lock window is increased to reduce the sensitivity of the clock phase circuit to clock jitter.

Window extension circuit 1330 includes NAND gate 1336, inverter 1335, and transmission gates 1331, 1334. Inverter 1335 and transmission gates 1331, 1334 together implement a multiplexer controlled by the output of NAND gate 1336. (In other embodiments of the invention, other implementations of this multiplexer are used.) NAND gate 1336 is driven by the lock output signal LOCK and by a window extend enable signal WINEN.

When signal WINEN is low, the window extension feature is disabled. NAND gate 1336 provides a high value, transmission gate 1331 is enabled, transmission gate 1334 is disabled, and inverters 703, 704 are bypassed.

When signal WINEN is high, the window extension feature is enabled. Before a lock is achieved, signal LOCK is low, NAND gate 1336 provides a high value, and inverters 703, 704 are bypassed. After a lock is achieved, signal LOCK is high, NAND gate 1336 provides a low value, and inverters 703, 704 are inserted into the path between the clock input terminal CLKIN and signal DCLKIN. Thus, the delay on the path increases, and the lock window is extended.

Figure 14:
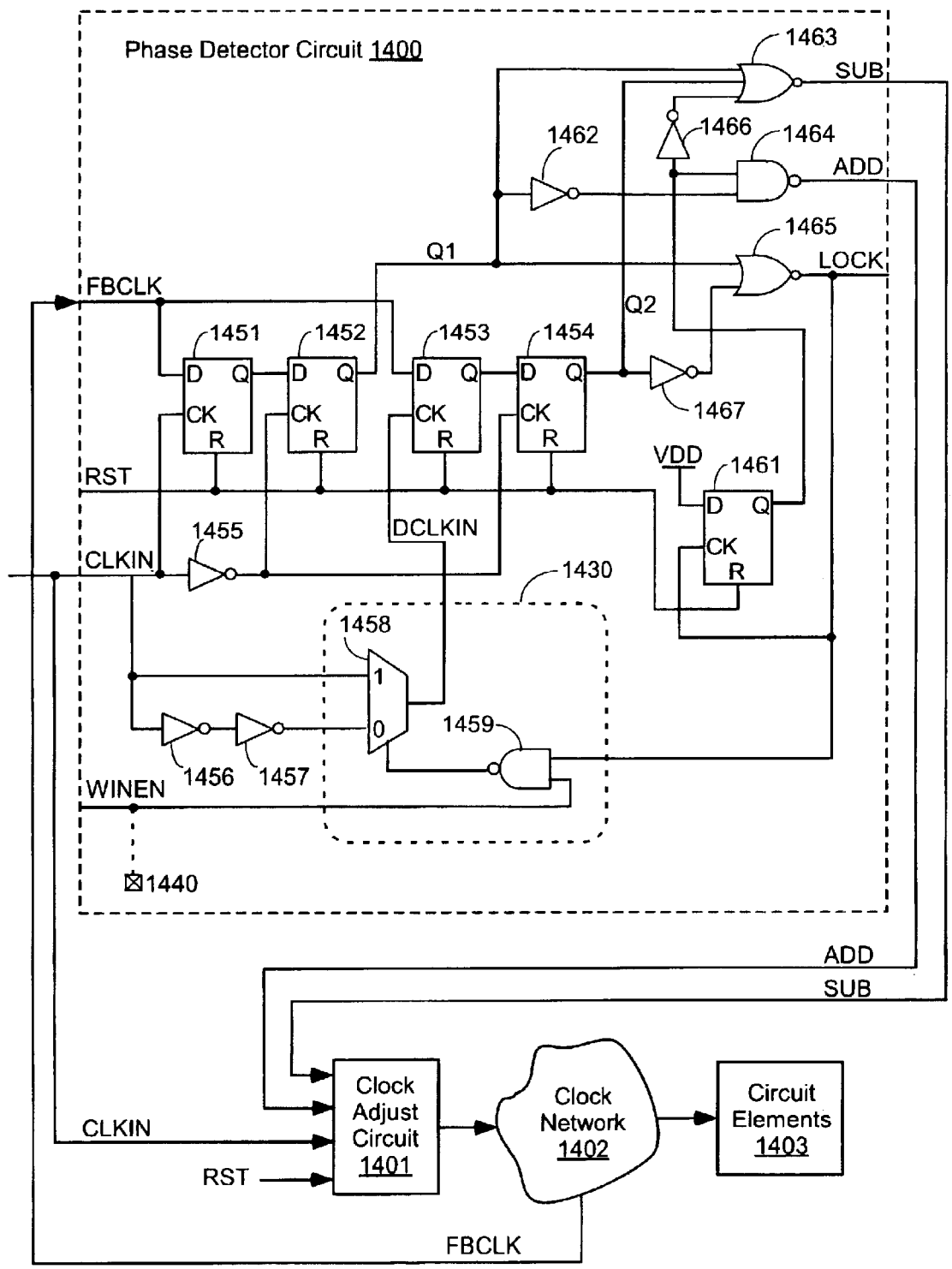
FIG. 14 shows a system including a eighth phase detector circuit in accordance with one embodiment of the invention.

FIG. 14 shows a system including a eighth phase detector circuit 1400 according to one embodiment of the invention. Also included in the system of FIG. 14 are clock adjust circuit 1401, clock network 1402, and circuit elements 1403. In the embodiment of FIG. 14, clock adjust circuit 1401 is a DLL, e.g., similar to DLL 101 of FIG. 1. Phase detector circuit 1400 samples the feedback clock signal FBCLK (i.e., stores values Q1 and Q2) a second time on the falling edge of signal CLKIN. This adds an extra degree of safely in case of a glitch in the original flip-flops.

Phase detector circuit 1400 includes D flip-flops 1451–1454 and 1461; a delay element including inverters 1456 and 1457; window extension circuit 1430; inverters 1455, 1462, 1466, and 1467; NOR gates 1463, 1465, and NAND gate 1464. Window extension circuit 1430 includes multiplexer 1458 and NAND gate 1459 and can be implemented, for example, in the same way as window extension circuit 1330 of FIG. 13. Essentially, multiplexer 1458 selects either signal CLKIN or signal CLKIN delayed by inverters 1456 and 1457, under the control of NAND gate 1459, to provide signal DCLKIN. NAND gate 1459 is in turn controlled by window extend enable signal WINEN and the lock output signal LOCK.

Flip-flop 1451 has a data input terminal D coupled to receive signal FBCLK, a clock input terminal CK coupled to receive signal CLKIN, an optional reset terminal R coupled to receive a reset signal RST, and an output terminal Q. Flip-flop 1452 has a data input terminal D coupled to receive the output signal Q from flip-flop 1451, a clock input terminal CK coupled to receive signal CLKIN inverted by inverter 1455, an optional reset terminal R coupled to receive a reset signal RST, and an output terminal Q that provides value Q1.

Flip-flop 1453 has a data input terminal D coupled to receive signal FBCLK, a clock input terminal CK coupled to receive signal DCLKIN, an optional reset terminal R coupled to receive a reset signal RST, and an output terminal Q. Signal DCLKIN is provided by multiplexer 1458 of window extension circuit 1430. Flip-flop 1454 has a data input terminal D coupled to receive the output signal Q from flip-flop 1453, a clock input terminal CK coupled to receive signal CLKIN inverted by inverter 1455, an optional reset terminal R coupled to receive a reset signal RST, and an output terminal Q that provides value Q2.

Flip-flop 146.1 has a data input terminal D coupled to power high VDD, a clock input terminal CK coupled to receive the lock output signal LOCK, an optional reset terminal R coupled to receive a reset signal RST, and an output terminal Q.

In the pictured embodiment, flip-flop 1461 is an initialization circuit present to ensure that clock adjust circuit 1401 functions properly after reset. In the pictured embodiment, clock adjust circuit 1401 is a DLL (e.g., similar to clock adjust circuit 101 of FIG. 1). In other embodiments, clock adjust circuit 1401 is a PLL.

Flip-flop 1461 functions as follows. When reset signal RST is high, flip-flop 1461 provides a low value to inverter 1466 and NAND gate 1464. Thus, signal SUB is low, and signal ADD is high. Therefore, when reset signal RST goes low (i.e., the phase detector circuit is enabled), the ADD signal remains high until the lock signal LOCK goes high and clocks flip-flop 1461, forcing the flip-flop output signal Q high. After the first lock occurs, phase detector circuit 1400 then appropriately adds or subtracts delay as necessary to maintain the lock.

Note that flip-flop 1461 can also optionally be added to the embodiments illustrated in FIGS. 7–13. Other embodiments can include other circuit elements that perform an initialization function. In some embodiments, the initialization circuitry is implemented within clock adjust circuit 701, e.g., in a finite state machine similar to state machine 112 of FIG. 1.

NOR gate 1463 provides the subtract output signal SUB and is driven by signals Q1 and Q2, and by the Q output signal from flip-flop 1461, inverted by inverter 1466. NAND gate 1464 provides the add output signal ADD and is driven by signal Q1 inverted by inverter 1462 and by the Q output signal from flip-flop 1461. NOR gate 1465 provides the lock output signal LOCK, and is driven by signal Q1 and by signal Q2 inverted by inverter 1467.

Note that the logic providing output signals SUB, ADD, and LOCK can be implemented in various ways. For example, these signals can be generated using logic similar to those variations described above in connection with FIG. 7. It will be apparent to one skilled in the art after reading this specification that the present invention can be practiced within these and other architectural variations.

Those having skill in the relevant arts of the invention will now perceive various modifications and additions that can be made as a result of the disclosure herein. For example, the above text describes the circuits and methods of the invention in the context of ICs such as programmable logic devices (PLDs). However, the circuits of the invention can also be implemented in other electronic systems, for example, in printed circuit boards including discrete devices. The circuits of the invention can also be implemented in non-programmable devices.

Further, delay elements, memory elements, flip-flops, logic gates, NOR gates, NAND gates, inverters, multiplexers, transmission gates, transistors, P-channel transistors, N-channel transistors, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A phase detector circuit, comprising:
 a feedback input terminal;
 a clock input terminal;
 subtract and add output terminals;
 a first memory element having a clock terminal coupled to the clock input terminal of the phase detector circuit, a data input terminal coupled to the feedback input terminal of the phase detector circuit, and an output terminal coupled to the add output terminal of the phase detector circuit;
 a second memory element having a clock terminal, a data input terminal coupled to the feedback input terminal of the phase detector circuit, and an output terminal;
 a first delay element coupled between the clock input terminal of the phase detector circuit and the clock terminal of the second memory element; and
 a first logic gate having a first input terminal coupled to the output terminal of the first memory element, a second input terminal coupled to the output terminal of the second memory element, and an output terminal coupled to the subtract output terminal of the phase detector circuit,
 wherein a signal on the add output terminal of the phase detector circuit is independent of a signal on the output terminal of the second memory element, and
 wherein the first delay element is programmable.

2. The phase detector circuit of claim 1, wherein the first logic gate is a two-input logic gate.

3. The phase detector circuit of claim 1, wherein the first logic gate is a NOR gate.

4. A phase detector circuit, comprising:
 a feedback input terminal;
 a clock input terminal;
 subtract and add output terminals;
 a first memory element having a clock terminal coupled to the clock input terminal of the phase detector circuit, a data input terminal coupled to the feedback input terminal of the phase detector circuit, and an output terminal coupled to the add output terminal of the phase detector circuit;
 a second memory element having a clock terminal, a data input terminal coupled to the feedback input terminal of the phase detector circuit, and an output terminal;
 a first delay element coupled between the clock input terminal of the phase detector circuit and the clock terminal of the second memory element;
 a first logic gate having a first input terminal coupled to the output terminal of the first memory element, a second input terminal coupled to the output terminal of the second memory element, and an output terminal coupled to the subtract output terminal of the Phase detector circuit; and
 a second delay element coupled between the feedback input terminal of the phase detector circuit and the data input terminals of the first and second memory elements, wherein the second delay element has a shorter delay than the first delay element,
 wherein a signal on the add output terminal of the phase detector circuit is independent of a signal on the output terminal of the second memory element.

5. The phase detector circuit of claim 4, wherein the second delay element comprises a transmission gate, and wherein the transmission gate is enabled whenever power is applied to the phase detector circuit.

6. The phase detector circuit of claim 4, wherein the second delay element comprises two inverters coupled in series, and the first delay element comprises four inverters coupled in series.

7. A phase detector circuit, comprising:
 a feedback input terminal:
 a clock input terminal;
 subtract and add output terminals;
 a first memory element having a clock terminal coupled to the clock input terminal of the phase detector circuit, a data input terminal coupled to the feedback input terminal of the phase detector circuit, and an output terminal coupled to the add output terminal of the phase detector circuit;
 a second memory element having a clock terminal, a data input terminal coupled to the feedback input terminal of the phase detector circuit, and an output terminal;
 a first delay element coupled between the clock input terminal of the phase detector circuit and the clock terminal of the second memory element;
 a first logic gate having a first input terminal coupled to the output terminal of the first memory element, a second input terminal coupled to the output terminal of the second memory element, and an output terminal coupled to the subtract output terminal of the phase detector circuit;
 an offset left/right select input terminal;
 a first multiplexer having a first data input terminal coupled to the feedback input terminal of the phase detector circuit, a second data input terminal coupled to the clock input terminal of the phase detector circuit, a select terminal coupled to the offset left/right select input terminal, and an output terminal coupled to the data input terminals of the first and second memory elements; and
 a second multiplexer having a first data input terminal coupled to the clock input terminal of the phase detector circuit, a second data input terminal coupled to the feedback input terminal of the phase detector circuit, a select terminal coupled to the offset left/right select input terminal, and an output terminal coupled to the clock terminal of the first memory element and to an input terminal of the first delay element,
 wherein a signal on the add output terminal of the phase detector circuit is independent of a signal on the output terminal of the second memory element.

8. The phase detector circuit of claim 1, wherein the first delay element-comprises a transmission gate, and wherein the transmission gate is enabled whenever power is applied to the phase detector circuit.

9. The phase detector circuit of claim 1, wherein the first delay element comprises two inverters coupled in series.

10. A phase detector circuit, comprising:
a feedback input terminal;
a clock input terminal;
subtract and add output terminals;
a first memory element having a clock terminal coupled to the clock input terminal of the phase detector circuit, a data input terminal coupled to the feedback input terminal of the phase detector circuit, and an output terminal coupled to the add output terminal of the phase detector circuit;
a second memory element having a clock terminal, a data input terminal coupled to the feedback input terminal of the phase detector circuit, and an output terminal;
a first delay element coupled between the clock input terminal of the phase detector circuit and the clock terminal of the second memory element;
a first logic crate having a first input terminal coupled to the output terminal of the first memory element, a second input terminal coupled to the output terminal of the second memory element, and an output terminal coupled to the subtract output terminal of the phase detector circuit;
a lock output terminal; and
a second logic gate having a first input terminal coupled to the output terminal of the first memory element, a second input terminal coupled to the output terminal of the second memory element, and an output terminal coupled to the lock output terminal of the phase detector circuit,
wherein a signal on the add output terminal of the phase detector circuit is independent of a signal on the output terminal of the second memory element.

11. The phase detector circuit of claim 10, wherein the second logic gate is a two-input logic gate.

12. The phase detector circuit of claim 10, wherein:
the second logic gate is a NOR gate; and
the phase detector circuit further comprises an inverter coupled between the output terminal of the second memory element and the second input terminal of the second logic gate.

13. The phase detector circuit of claim 10, further comprising:
a window extend enable terminal; and
a window extension circuit having a first input terminal coupled to the lock output terminal of the phase detector circuit, a second input terminal coupled to the window extend enable terminal, a third input terminal coupled to the clock input terminal of the phase detector circuit, a fourth input terminal coupled to an output terminal of the first delay element, and an output terminal coupled to the clock terminal of the second memory element.

14. The phase detector circuit of claim 13, wherein the window extension circuit comprises:
a NAND gate having a first input terminal coupled to the lock output terminal of the phase detector circuit, a second input terminal coupled to the window extend enable terminal, and an output terminal; and
a multiplexer having a first data input terminal coupled to the clock input terminal of the phase detector circuit, a second data input terminal coupled to the output terminal of the first delay element, and a select terminal coupled to the output terminal of the NAND gate.

15. The phase detector circuit of claim 1, wherein the first and second memory elements are flip-flops.

16. The phase detector circuit of claim 15, wherein each of the first and second memory elements comprises a reset input terminal.

17. A system, comprising:
a clock input terminal;
a clock adjust circuit having a clock input terminal coupled to the clock input terminal of the system, a subtract input terminal, an add input terminal, and a clock output terminal;
a clock network having an input terminal coupled to the clock output terminal of the clock adjust circuit, and further having a feedback output terminal and additional output terminals;
a plurality of circuit elements having clock input terminals coupled to the additional output terminals of the clock network; and
a phase detector circuit, comprising:
a feedback input terminal coupled to the feedback output terminal of the clock network;
a clock input terminal coupled to the clock input terminal of the system;
a subtract output terminal coupled to the subtract input terminal of the clock adjust circuit;
an add output terminal coupled to the add input terminal of the clock adjust circuit;
a first memory element having a clock terminal coupled to the clock input terminal of the phase detector circuit, a data input terminal coupled to the feedback input terminal of the phase detector circuit, and an output terminal coupled to the add output terminal of the phase detector circuit;
a second memory element having a clock terminal, a data input terminal coupled to the feedback input terminal of the phase detector circuit, and an output terminal;
a first delay element coupled between the clock input terminal of the phase detector circuit and the clock terminal of the second memory element; and
a first logic gate having a first input terminal coupled to the output terminal of the first memory element, a second input terminal coupled to the output terminal of the second memory element, and an output terminal coupled to the subtract output terminal of the phase detector circuit,
wherein a signal on the add output terminal of the phase detector circuit is independent of a signal on the output terminal of the second memory element.

18. The system of claim 17, wherein the first logic gate is a two-input logic gate.

19. The system of claim 17, wherein the first logic gate is a NOR gate.

20. The system of claim 17, wherein the phase detector circuit further comprises a second delay element coupled between the feedback input terminal of the phase detector circuit and the data input terminals of the first and second memory elements, wherein the second delay element has a shorter delay than the first delay element.

21. The system of claim 20, wherein the second delay element comprises a transmission gate, and wherein the transmission gate is enabled whenever power is applied to the phase detector circuit.

22. The system of claim 20, wherein the second delay element comprises two inverters coupled in series, and the first delay element comprises four inverters coupled in series.

23. The system of claim 17, wherein the phase detector circuit further comprises:
an offset left/right select input terminal;
a first multiplexer having a first data input terminal coupled to the feedback input terminal of the phase detector circuit, a second data input terminal coupled to the clock input terminal of the phase detector circuit, a select terminal coupled to the offset left/right select input terminal, and an output terminal coupled to the data input terminals of the first and second memory elements; and
a second multiplexer having a first data input terminal coupled to the clock input terminal of the phase detector circuit, a second data input terminal coupled to the feedback input terminal of the phase detector circuit, a select terminal coupled to the offset left/right select input terminal, and an output terminal coupled to the clock terminal of the first memory element and to an input terminal of the first delay element.

24. The system of claim 17, wherein the first delay element is programmable.

25. The system of claim 17, wherein the first delay element comprises a transmission gate, and wherein the transmission gate is enabled whenever power is applied to the phase detector circuit.

26. The system of claim 17, wherein the first delay element comprises two inverters coupled in series.

27. The system of claim 17, wherein the phase detector circuit further comprises:
a lock output terminal; and
a second logic gate having a first input terminal coupled to the output terminal of the first memory element, a second input terminal coupled to the output terminal of the second memory element, and an output terminal coupled to the lock output terminal of the phase detector circuit.

28. The system of claim 27, wherein the second logic gate is a two-input logic gate.

29. The system of claim 27, wherein:
the second logic gate is a NOR gate; and
the phase detector circuit further comprises an inverter coupled between the output terminal of the second memory element and the second input terminal of the second logic gate.

30. The system of claim 27, wherein the phase detector circuit further comprises:
a window extend enable terminal; and
a window extension circuit having a first input terminal coupled to the lock output terminal of the phase detector circuit, a second input terminal coupled to the window extend enable terminal, a third input terminal coupled to the clock input terminal of the phase detector circuit, a fourth input terminal coupled to an output terminal of the first delay element, and an output terminal coupled to the clock terminal of the second memory element.

31. The system of claim 30, wherein the system comprises a programmable logic device (PLD), and the phase detector circuit further comprises a programmable memory element of the PLD coupled to the window extend enable terminal.

32. The system of claim 30, wherein the window extension circuit comprises:
a NAND gate having a first input terminal coupled to the lock output terminal of the phase detector circuit, a second input terminal coupled to the window extend enable terminal, and an output terminal; and
a multiplexer having a first data input terminal coupled to the clock input terminal of the phase detector circuit, a second data input terminal coupled to the output terminal of the first delay element, and a select terminal coupled to the output terminal of the NAND gate.

33. The system of claim 17, wherein the clock adjust circuit is a delay lock loop (DLL).

34. The system of claim 17, wherein the clock adjust circuit is a phase lock loop (PLL).

35. The system of claim 17, wherein the first and second memory elements are flip-flops.

36. The system of claim 35, wherein the clock adjust circuit comprises a reset input terminal, and each of the first and second memory elements comprises a reset input terminal coupled to the reset input terminal of the clock adjust circuit.

37. A method of detecting and reporting a difference in phase between an input clock signal and a feedback clock signal, the method comprising:
storing a first value of the feedback clock signal in a first memory element when the input clock signal changes state in a predetermined direction;
delaying the input clock signal to provide a delayed input clock signal;
storing a second value of the feedback clock signal in a second memory element when the delayed input clock signal changes state in the predetermined direction;
providing an active subtract signal when each of the first and second memory elements stores a first predetermined value;
providing an active add signal when the first memory element stores a second predetermined value; and
providing an active lock signal when the first memory element stores the first predetermined value and the second memory element stores the second predetermined value.

38. A method of detecting and reporting a difference in phase between an input clock signal and a feedback clock signal, the method comprising:
storing a first value of the feedback clock signal in a first memory element when the input clock signal changes state in a predetermined direction;
delaying the input clock signal to provide a delayed input clock signal;
storing a second value of the feedback clock signal in a second memory element when the delayed input clock signal chances state in the predetermined direction;
providing an active subtract signal when each of the first and second memory elements stores a first predetermined value; and
providing an active add signal when the first memory element stores a second predetermined value,
wherein delaying the input clock signal to provide a delayed input clock signal comprises delaying the input clock signal by one of two supported delay values.

39. The method of claim 38, further comprising selecting one of the two supported delay values.

40. The method of claim 38, further comprising:
providing an active lock signal when the first memory element stores the first predetermined value and the second memory element stores the second predetermined value; and
using the active lock signal to select one of the two supported delay values.

* * * * *